United States Patent
Li

(10) Patent No.: US 8,124,462 B2
(45) Date of Patent: Feb. 28, 2012

(54) ENHANCED INTEGRATED CIRCUIT PACKAGE

(75) Inventor: Tung Lok Li, Hong Kong (HK)

(73) Assignee: Blondwich Limited, Tsuen Wan, Kowloon (HK)

( * ) Notice: Subject to any disclaimer, the term of this patent is extended or adjusted under 35 U.S.C. 154(b) by 0 days.

(21) Appl. No.: 13/113,089

(22) Filed: May 23, 2011

(65) Prior Publication Data
US 2011/0219611 A1    Sep. 15, 2011

Related U.S. Application Data

(62) Division of application No. 12/511,077, filed on Jul. 29, 2009, now Pat. No. 7,973,394.

(60) Provisional application No. 61/185,968, filed on Jun. 10, 2009.

(51) Int. Cl.
*H01R 43/00*    (2006.01)
(52) U.S. Cl. .................. 438/123; 438/111; 29/825
(58) Field of Classification Search .............. 438/111, 438/112, 123, 124, 127; 257/692, E23.031; 29/825
See application file for complete search history.

(56) References Cited

U.S. PATENT DOCUMENTS

| | | | |
|---|---|---|---|
| 6,075,281 | A | 6/2000 | Liao et al. |
| 6,849,931 | B2 | 2/2005 | Nakae |
| 7,408,242 | B2 * | 8/2008 | Yamanaka et al. ............ 257/666 |
| 2003/0003627 | A1 | 1/2003 | Yamaguchi et al. |
| 2006/0113665 | A1 | 6/2006 | Lee et al. |
| 2009/0014848 | A1 | 1/2009 | Ong Wai Lian et al. |

FOREIGN PATENT DOCUMENTS
CN    1148637 A    4/1997

\* cited by examiner

*Primary Examiner* — Roy Potter
(74) *Attorney, Agent, or Firm* — Eagle IP Limited; Jacqueline C. Lui

(57) ABSTRACT

A semiconductor including a selectively plated lead frame is disclosed. The lead frame contains a die pad and a plurality of lead fingers, where each lead finger is formed with a bonding pad on the center portion of the lead finger by selective plating. The surface area of the lead finger material is increased so the adhesion to molding material is improved. The edges of the lead finger tips are half etched to further increase the surface area of lead finger material. A method of manufacturing the lead frame is also provided.

9 Claims, 6 Drawing Sheets

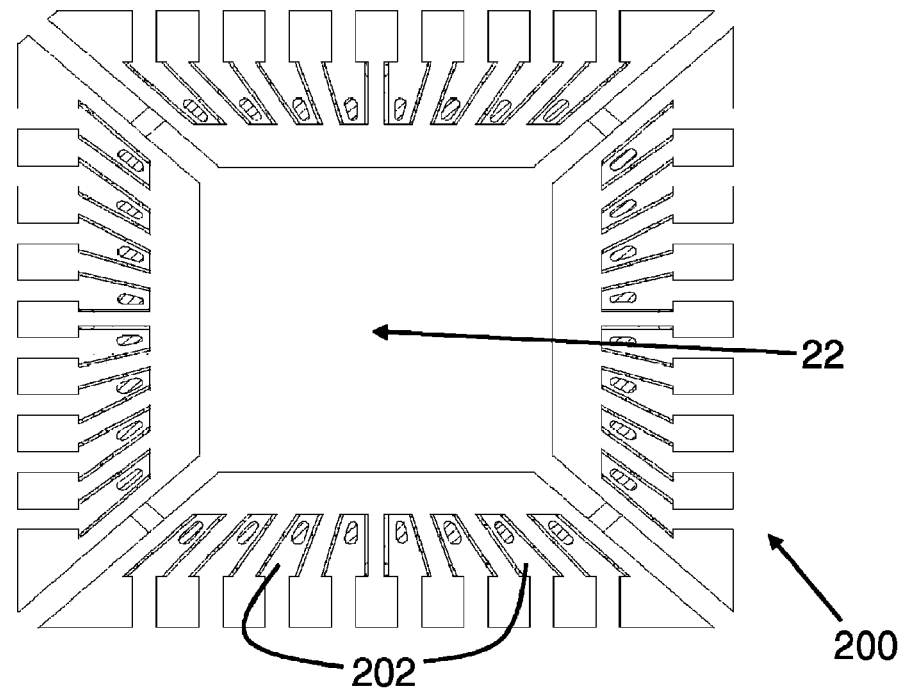
Fig.2c
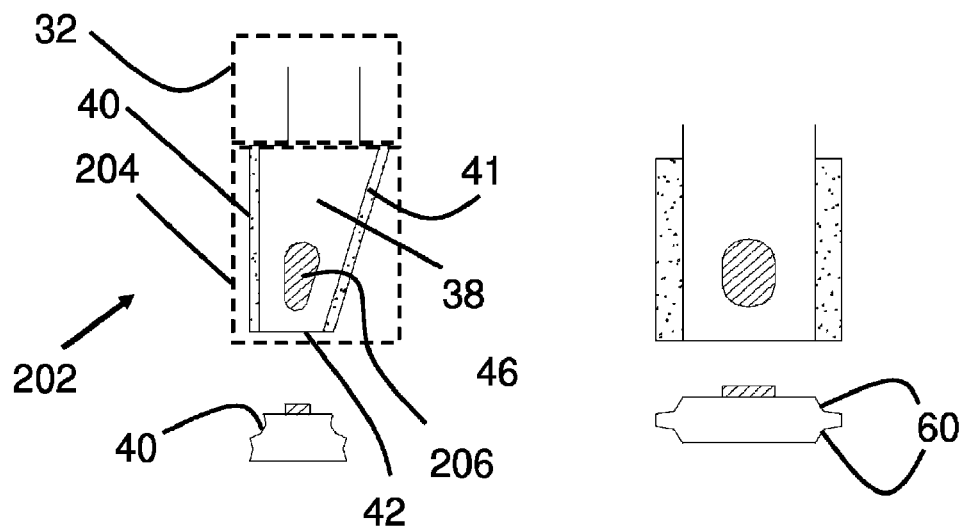
Fig. 3a
Fig. 3b

ENHANCED INTEGRATED CIRCUIT PACKAGE

CROSS-REFERENCE TO RELATED APPLICATION

This application is a divisional application of U.S. Nonprovisional Application having Ser. No. 12/511,077 filed on Jul. 29, 2009, which claims benefit under 35 U.S.C. §119(e) of U.S. Provisional Application having Ser. No. 61/185,968 filed Jun. 10, 2009, which are hereby incorporated by reference herein in its entireties.

FIELD OF INVENTION

This patent application relates generally to integrated circuit (IC) packaging technology and, in particular, but not by way of imitation, to IC packages having selectively etched internal lead tips.

BACKGROUND OF INVENTION

IC packages often incorporate IC chips mounted to lead frames. Lead frames are often formed from a metal sheet, such as, for example, copper or a copper alloy, by forming various patterns on a top surface thereof by, for example, a stamping and/or punching process or by an etching process. The IC chips are often mounted in a center region of the lead frame and electrically coupled to the lead frame via wire bonds from the IC chip to bonding areas disposed around the IC chip. Oftentimes, the bonding pads are disposed on bonding fingers extending radially outwardly.

In general, the bonding areas may be plated to facilitate bonding between the wire bonds and the bonding areas. In the past, an etching process created the bonding areas on the lead fingers and a plating process plated the entire bonding area with a metal, such as, for example, silver or a silver alloy. Plating the entire surface area of the relative large, flat tabs created a plurality of problems, including, among other things, non-uniform distances between adjacent wire bonds around the leadframe.

SUMMARY OF INVENTION

In the light of the foregoing background, it is an object of the present invention to provide an improved lead frame and semiconductor package made thereof.

Accordingly, the present invention in one aspect is a solderable lead frame including a die pad, a plurality of lead fingers and a bonding pad plated onto a first surface of each of the lead fingers. Each lead finger is arranged along and extending from the side portion of the die pad. The bonding pad is disposed in the center portion of the tip of the lead finger and withdrawn from the perimeter of the surface of the lead finger, such that lead frame material is provided on all sides of the first surface of the lead finger as an attachment surface for molding.

In another aspect of the present invention, there is provided a semiconductor package which includes at least one semiconductor chip, a lead frame, bonding wires and an encapsulant. The lead frame includes a die pad by which the semiconductor chip is supported, a plurality of lead fingers each is arranged along and extending from the side portion of the die pad, and a bonding pad plated onto a first surface of each of the lead fingers. The bonding pad is disposed in the center portion of the tip of the lead finger and withdrawn from the perimeter of the surface of the lead finger, such that lead frame material is provided on all sides of the first surface of the lead finger as an attachment surface for molding. The bonding wires electrically connect the semiconductor chip and the inner tips of the lead fingers. The encapsulant is formed for encapsulating the semiconductor chip, the die pad and the inner portions of the lead fingers.

In a further aspect of the present invention, a method of manufacturing a lead frame includes the steps of etching a portion of a metal plate to be formed into a die pad and tips of a plurality of lead fingers of the lead frame, forming the lead fingers of the lead frame by subjecting the metal plate to a stamping process or an etching process, plating a bonding pad on a first surface of tip of each lead finger, and trimming the tips of the plurality of lead fingers. The bonding pad is disposed in the center portion of the tip of the lead finger and withdrawn from perimeter of the surface of the lead finger, such that lead frame material is provided on all sides of the first surface of the bonding pad as an attachment surface for molding.

In a more preferred embodiment, at least one edge of the tip of the lead finger further includes a selectively etched pattern for increasing the surface area for adhesion to a molding material.

There are many advantages to the present invention, one of which is that the adhesion of the lead fingers of the lead frame to the molding material is greatly improved when selective plating and/or selective etching are applied. As the plating is selectively applied to only the center portion of the tips, more area of the metallic substrate is exposed to the molding material. Since lead frame material adheres to the molding material better than noble metals used at the bonding pad, the adhesion of the lead fingers under selective plating is improved. Furthermore, the selective etching manufacturing process also increases the surface area of the substrate for metal-to-molding-material adhesion. Thus, the overall reliability of the semiconductor package can also be improved.

Another advantage of the present invention is that the bleeding phenomenon of noble metal over the edge of the lead tips can be effectively eliminated. Since plating of noble metal in the present invention is only selectively applied to the center portion of the lead tip surface, but not to the edge of the tip surface, bleeding will not take place. Not only will the selective plating process conserve the consumption of noble metal, the absence of bleeding will also prevent the chance of electrical short-circuit between the lead tips.

Moreover, by selective etching of the top surfaces of the lead tips, the center of gravity of the lead tips of the lead fingers is lowered compared to conventional plating method, so that the likelihood that the lead tips will move or become misaligned during the manufacturing process is reduced. This ensures the reliability, productivity and consistency of the whole semiconductor package.

BRIEF DESCRIPTION OF FIGURES

FIG. 1b shows an enlarged view of the lead tip of the lead frame structure in FIG. 1a.

FIG. 1c is the lead tip design of another conventional lead frame structure.

FIG. 2c shows the lead frame structure in a Quad Flat Package (QFP) package in one embodiment of the present invention.

FIG. 3a shows an enlarged view of the lead tip of the lead finger in FIG. 2c.

FIG. 3b shows another enlarged view of a lead tip of a lead frame in a Quad Flat No-lead (QFN) package.

DETAILED DESCRIPTION OF THE PREFERRED EMBODIMENTS

Various embodiment of the present invention will now be described more fully with reference to the accompanying drawings. The invention may, however, be embodied in many different forms and should not be construed as limited to the embodiments set forth herein; rather, the embodiments are provided so that this disclosure will be thorough and complete, and will fully convey the scope of the invention to those skilled in the art.

As used herein and in the claims, "comprising" means including the following elements but not excluding others; and "couple" or "connect" refer to electrical coupling or connection either directly or indirectly via one or more electrical means unless otherwise stated.

Figure 1A:
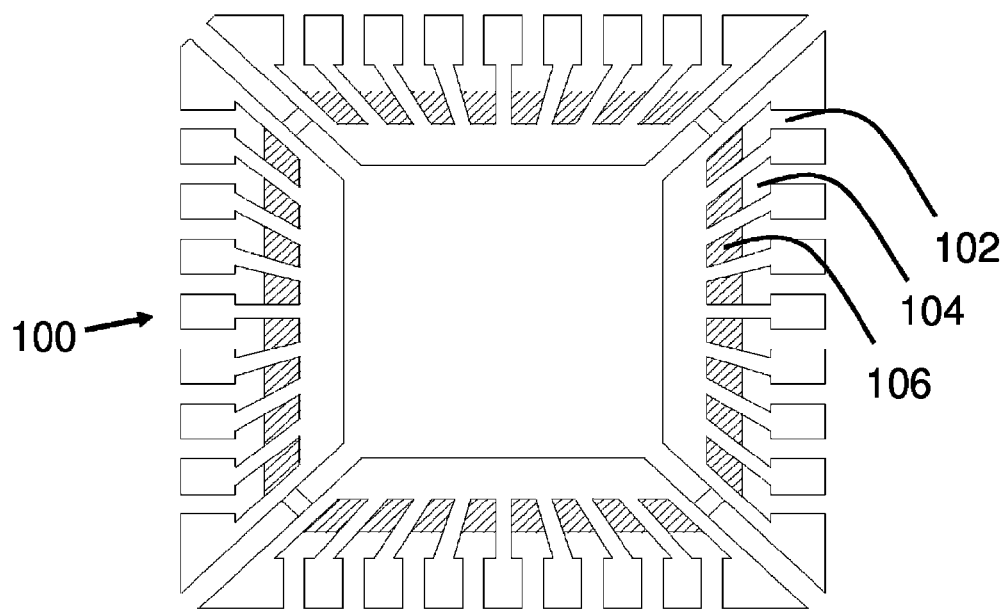
FIG. 1a shows a conventional lead frame structure and lead tip design used in a conventional semiconductor package.
Figures 1B, 1C:
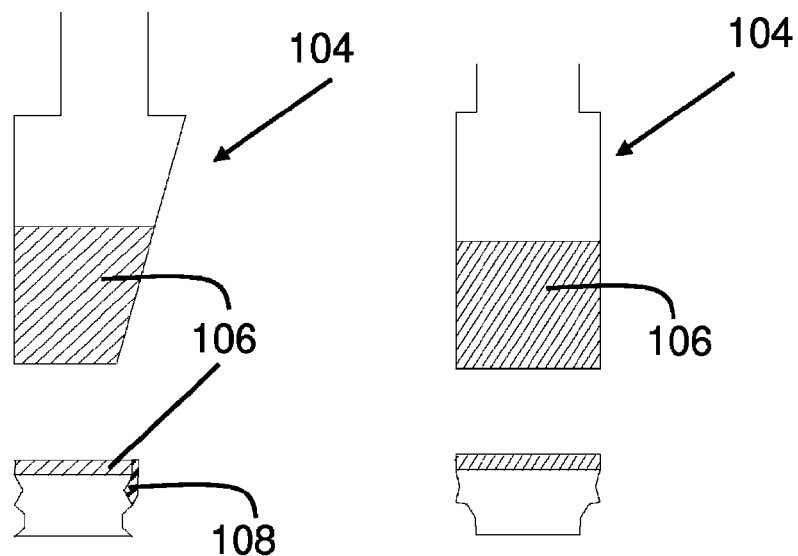

Referring now to FIG. 1a, a conventional lead frame 100 is shown having a plurality of lead fingers 102 extending along the periphery of the lead frame 100. Each of the lead fingers 102 has a lead tip 104 and each of the lead tips 104 has been plated to form a bonding pad 106 thereon for attaching wire bonds thereto. Referring now to FIG. 1b-1c, various views of two embodiments of lead tips 104 are shown having bonding pads 106. As can be seen from the side views of the lead tips 104, a top surface of the lead tips 104 is substantially the same width or larger than a bottom surface of the lead tips 104. Oftentimes, lead tips 104 are formed by etching a pattern in a top surface of a lead frame then etching through to isolate the lead tips by etching a pattern in a bottom surface of the lead frame. As shown in FIG. 1c, this may result in a top surface of the lead tip 104 being larger than a bottom surface of the lead tip 104 which could make the lead tip 104 unstable and wobbly. In addition, the relatively large top surface of the lead tips 104 and the bonding pad 106 disposed thereon provides a large surface area onto which wire bonds (not shown) may be bonded.

When noble metal is plated onto the lead tips 104 to form the bonding pad 106, the noble metal may spill over the edge of the lead tips 104, creating a 'bleeding' phenomenon 108 as shown in FIG. 1b that covers the side surface of the lead tip. Such bleeding will effectively reduce the insulating gap between two conducting lead tips which may increase the chance of electrical short-circuit between them.

Figure 2A:
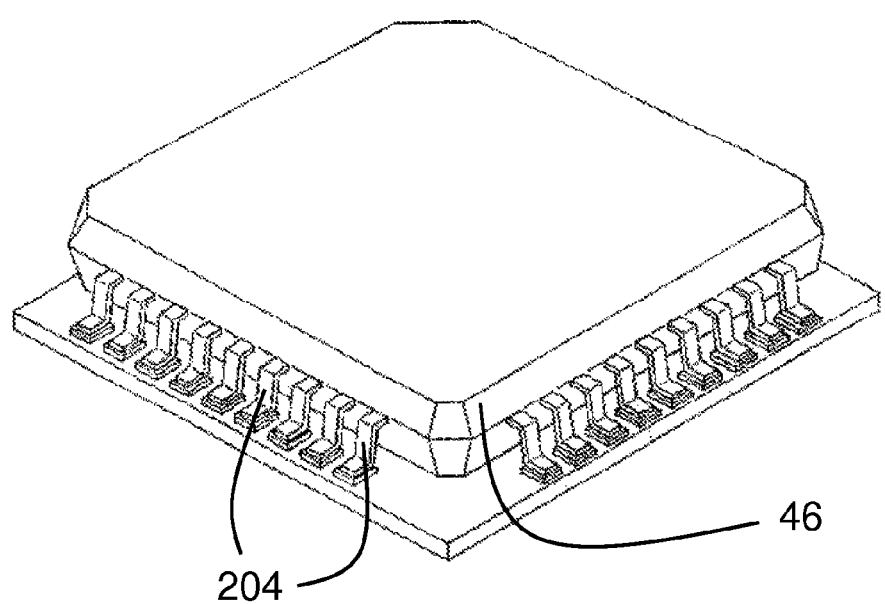
FIG. 2a is the three dimensional view of a semiconductor package according to one embodiment of the present invention.
Figure 2B:
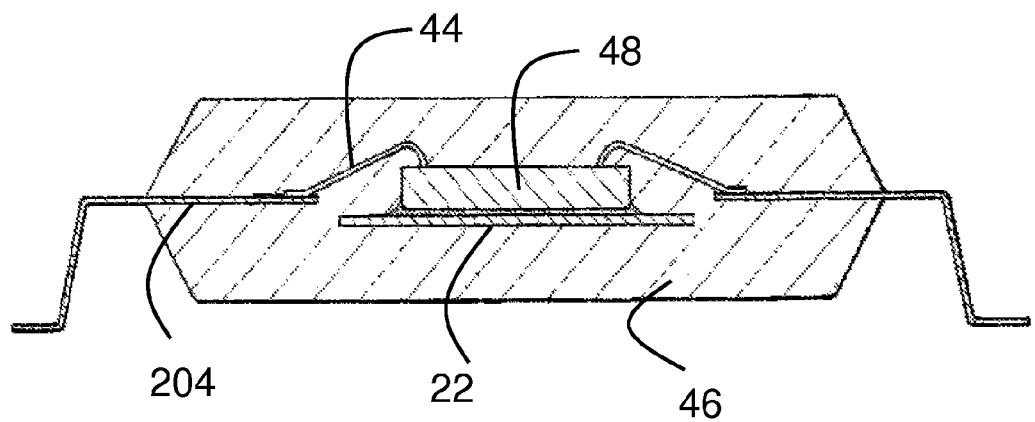
FIG. 2b shows cross-sectional view of the semiconductor package according to one embodiment of the present invention.

Referring now to FIG. 2a and FIG. 2b, a semiconductor package in one embodiment of the present invention contains a semiconductor chip 48, a lead frame including a plurality of lead fingers 202 and a die pad 22, where the die pad 22, the semiconductor chip 48 and the inner portion of the lead fingers 202 are encapsulated by a molding material or encapsulant 46. The semiconductor chip is placed on the die pad 22 and supported thereby. The plurality of lead fingers 202 are connected to the semiconductor chip 48 via bonding wires 44. Although a single semiconductor chip is shown in the aforementioned embodiment, more than one chip can be disposed on the die pad in various embodiments.

Turning to FIG. 2c and FIG. 2d in one embodiment of semiconductor packaging, the lead frame 200 includes the die pad 22 and the plurality of lead fingers 202. The lead fingers 202 are disposed around the quadrilateral periphery of the lead frame 200 and form an opening region at the center. In the exemplary embodiment shown here, the semiconductor package is a Quad Flat Package (QFP) package, where the lead fingers 202 extending out of the lead frame 200 from each of the four sides.

For the QFP package, each lead finger 202 is made up of two portions: the lead tip 204 and the base 32. The base 32 is the connecting portion for connecting the lead tip 204 to the exterior part of the lead finger 202. The lead tip 204 includes two surfaces: a top surface 38 and a bottom surface (not shown). In this invention, bonding pad 206 is created by depositing noble metal onto the center portion of the top surface 38. This is referred as selective plating. In this implementation, the plating material does not cover the whole area of the lead tip 204 and is withdrawn from the perimeter. In one embodiment, the bonding pad 206 will not be extended to the three edges 40, 41 and 42 of the lead tip 204. As a result, the top surface 38 of the lead finger 202 will not be fully covered by the bonding pad 206. In another embodiment, the bonding pad 206 extends and covers one or more edges 40, 41 or 42 of the lead tips, but not all of the edges 40, 41 and 42.

In one embodiment, the material used in selective plating is a noble metal, which is different from the lead-frame material. The latter has a better adhesion property with the molding material than the noble metal. As the bonding pad 206 does not cover the entire surface of the lead tip 204 through selective plating, the non-covered surface area of the lead tip can form better adhesion to the molding material. As a result, the overall adhesion of the lead fingers to the molding material is improved. Also, compared to full plating, less noble metal is consumed in making the bonding pad 206. Furthermore, the smaller bonding pad 206 achieved by selective plating also provide less area for wire bonds to be attached thereto, thereby making the placement of the wires more tightly controlled and the spacing between adjacent wire bonds more uniform. Since the bonding tip of the leadframe is now selectively plated, the noble metal will not breed out to the edge or edges of the lead finger.

Referring now to FIG. 3a-3b, magnified views of various embodiments of lead tips 204 are shown. As can be seen in the side views of the cross sections, edges of the lead tips 204 have been selectively etched such that top surfaces of the lead tips 204 are smaller than bottom surfaces of the lead tips 204. In this way, a greater stability is provided at wirebond due to this structure or due to a more tightly controlled bonding area on the top of the lead tip and a broaden area of support on the bottom of the lead tip. Thus the lead tips 104 may be more stable and less likely to move during manufacturing processes. In addition, only a small portion of each lead tip 204 has been plated to form the bonding areas 206 disposed on each lead tip 204. The smaller bonding areas 206 provide less area for wire bonds to be attached thereto, thereby increasing uniformity of distances between adjacent wire bonds.

Selectively etching the top surfaces of the lead tips lowers the structure of the lead tips to reduce the likelihood that the lead tips will move or become misaligned during the manufacturing process. Maintaining proper alignment of the lead tips is an important factor in reliability, productivity, and consistency.

In various embodiments, edges of an upper surface of the lead tips may be selectively etched to remove various amounts of the lead tips to create a plurality of different patterns. For example, the edges may be etched half way down, more than half way down, or less than half way down. In the exemplary embodiment as shown in FIG. 3a, half etching is applied and the two edges 40 and 41 of the first surface 38 of the lead finger 202 is created with a recess formed thereon. The curved contour of the edges 40 and 41 further increases the exposed surface area of the lead frame material and thus provides better adhesion to the molding material. Additionally, the edges 40 and 41 of the lead tips 204 have been selectively etched such that top surfaces 38 of the lead tips 204 are smaller than bottom surfaces of the lead tips 204. In this way, the lead structure may be lower and thus the lead tips 204 become more stable and less likely to move during manufacturing processes. Although in the aforementioned embodiments, selective etching or more specifically half-etching are applied to edges 40 and 41, it should be clear to those ordinary skilled in the art that such etching techniques can be applied to any combination of edges 40, 41 and 42.

In various embodiments, the width of the edges removed may be varied. In various embodiments, only a portion of the edges of the lead tips may be removed while in various embodiments, the entire length of one or more edges of the lead tips may be removed. In various embodiments, only the corners of the lead tip are removed such that the tops surfaces of the lead tips have a generally "+" shape. In various embodiments, the edges of the lead tips may be removed such that a cross section of the lead tips has an inverted "T" shape.

In another embodiment as shown in FIG. 3b, the selective plating described above can also be applied to Quad Flat No lead (QFN) package, where the tip of the lead finger is roughly in a rectangle shape instead of the approximately trapezoid shape in the QFP package. Further, the four edges of the tip of the lead finger and are also half etched, such that two recesses 60 are formed on each side of the tip.

Figure 4:
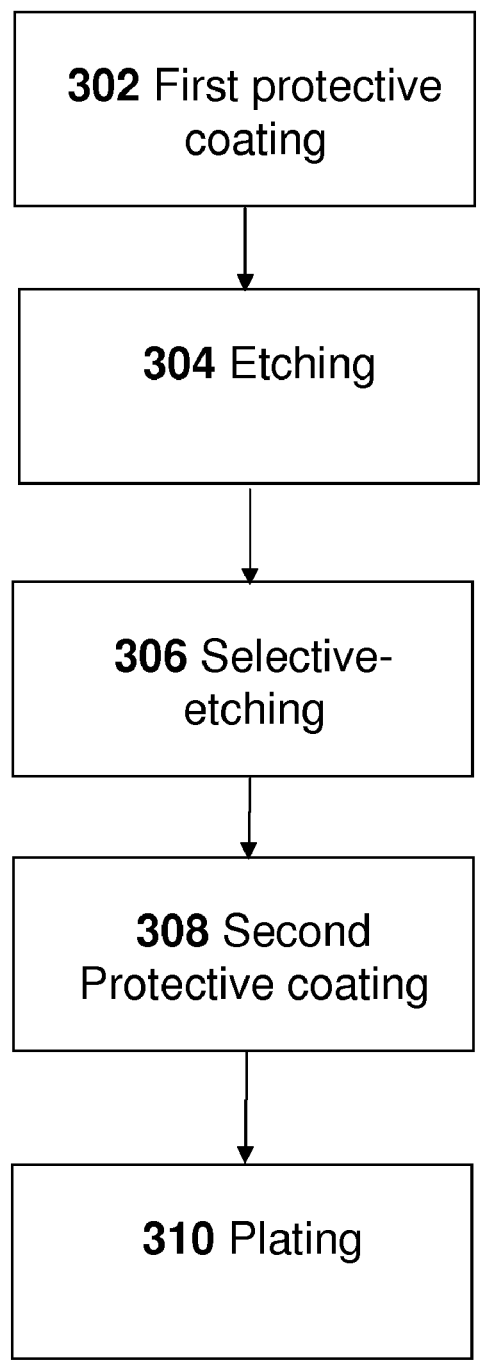
FIG. 4 shows the general flow of manufacturing the lead frame according to one embodiment of the present invention.

A method of manufacturing a lead frame with selective plating in accordance with one embodiment of the present invention is generally outlined in FIG. 4. First, a metal plate is coated with a protective coating in the first protective coating step 302. Then the protective coating will be selectively removed on those areas of the surface which are to be formed as spaces or gaps between lead fingers and spaces or gaps between the lead finger and the die pad. The protective coating can be a mechanical mask coating or a photo-resistant coating. This is followed by an etching step 304 that uses chemical means to etch out those areas in the lead frame that are not covered by the protective coating. After this step, lead fingers 202 are formed. Next, a selective-etching step 306 is applied to the lead tips 204 of the lead fingers 202 to increase the exposed surface area of the lead frame material for molding. Afterwards, in the second protective coating step 308, the lead frame is coated with a protective coating again, and the coating is selectively removed at the center portion of the lead tip that defines the bonding pad area. A plating step 310 then applies selective plating to deposit noble metal to that area to form bonding pads 206.

Figure 5:
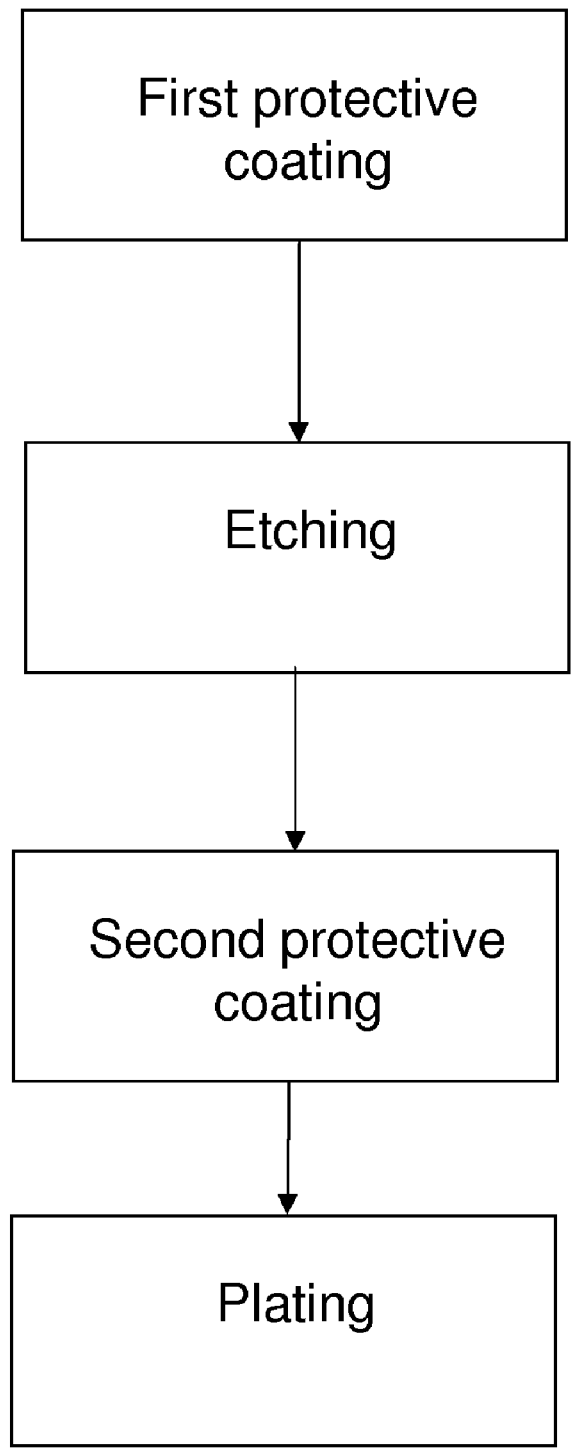
FIG. 5 shows the general flow of manufacturing the lead frame according to another embodiment of the present invention.

The method of manufacturing a lead frame in another embodiment is shown in FIG. 5. This method is similar to the method shown in FIG. 4 excepts that in FIG. 5, there is no selective etching step on the lead tips of the lead fingers.

Figure 6:
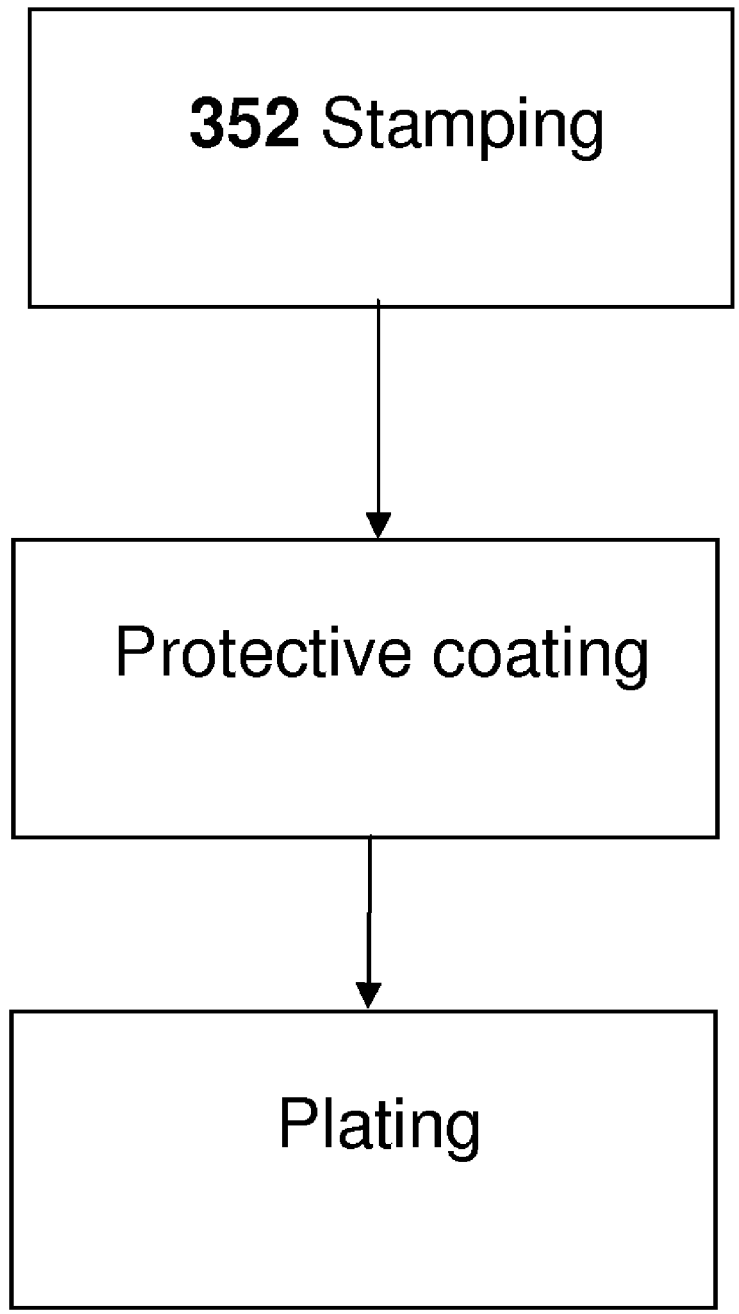
FIG. 6 shows the general flow of manufacturing the lead frame according to a further embodiment of the present invention.

FIG. 6 illustrates yet another method of manufacturing a lead frame. In this embodiment, the method is similar to the method shown in FIG. 5 except that the etching process to form the lead fingers and die pad is replaced by the stamping process 352. There is also no step of selective etching in this embodiment.

The exemplary embodiments of the present invention are thus fully described. Although the description referred to particular embodiments, it will be clear to one skilled in the art that the present invention may be practiced with variation of these specific details. Hence this invention should not be construed as limited to the embodiments set forth herein.

For example, although QFN and QFP package are shown as examples for the lead frame in the present invention in FIG. 2a, 2b, 2c and FIGS. 3a and 3b, it is clear that various lead frames used in other types of lead-frame based packaging methods can be applied the selective plating and/or half etching. Such packaging methods may include but not limited to Quad Flat J-leaded package (QFJ), Single In-line Package (SIP), and Dual in-line package (DIP) and Plastic Leaded Chip Carrier (PLCC).

Moreover, one skilled in the art should realize that the bonding pad formed by selectively plating on the top surface of the lead tips may be of a variety shapes and materials. In some embodiments, the bonding pads may be shaped in a circle, an oval, a square, a rectangle, an oblong shape, or any other shape. In some embodiments, the plating material used to form the bonding pads may be one or more of noble metals that include but not limited to gold, silver, platinum, palladium, nickel, iridium, rhodium, ruthenium, and osmium, or any other material that is suitable for such plating. In some embodiments, the bonding area may have a diameter of on the order of 3 mils (approximately 75 microns).

In various embodiments, the lead frame is made of that are normally component of either various copper alloys or nickel iron alloys or alloys In the embodiment shown in FIG. 2b and described above, the semiconductor package includes a die pad on which the semiconductor chip is carried. However, it should be clear to those with ordinary skilled in the end that the present invention may also be applied to those leadframe structures without a die pad.

In the various embodiments shown in FIGS. 4-6 and described above, the method of manufacturing the lead frame includes the step of plating the bond pads after the etching or stamping process. However, one skilled in the art should realized that the plating process may also be applied to form the bond pads before doing any etching/stamping process.

What is claimed is:

1. A method of manufacturing a lead frame, comprising the steps of:
   a) forming the lead fingers of said lead frame by subjecting a metal plate to a stamping process or an etching process;
   b) selectively plating a bonding pad on a first surface of lead tip of each said lead finger; and
   wherein said bonding pad being disposed in the center portion of said lead tip of said lead finger and withdrawn from at least one side of perimeter of said surface of said lead finger, such that lead frame material is provided on at least one side of said first surface of said bonding pad as an attachment surface for molding.

2. The method according to claim 1, wherein said lead frame further comprises a die pad.

3. The method according to claim 2, wherein said etching process further comprises the steps of coating said metal plate with a protective material; selectively removing said coating on areas of the surface of said lead tip which are to be formed as spaces between said lead fingers and spaces between said lead finger and said die pad; and etching out said spaces.

4. The method according to claim 2, wherein said selective plating step further comprises the steps of coating said lead frame with a protective material; selectively removing said coating at the center portion of said lead tip that defines said bonding pad area; and plating a noble metal layer to said bonding pad area.

5. The method according to claim 2, wherein at least one edge of said lead tip of said finger further comprises an selectively etched pattern for increasing the surface area for adhesion to a molding material.

6. The method according to claim 5, wherein said etched pattern is formed by applying half etching to said edge of said lead fingers.

7. The method according to claim 5, wherein the width of the top surface of said lead tip is smaller than the width of said the bottom surface of said tip.

8. The method according to claim 2, wherein said forming step is an etching process further comprising a first etching step to form a plurality of lead fingers and a second step to create an etched pattern on the surface of the lead tips of said plurality of lead fingers.

9. A method of manufacturing a lead frame, comprising the steps of:
   a) selectively plating a plurality of bonding pads on a first surface of said lead frame; and
   b) forming a plurality of lead fingers of said lead frame by subjecting a metal plate to a stamping process or an etching process, each said bonding pad being formed on a lead tip of each said lead finger;
   wherein said bonding pad being disposed in the center portion of said lead tip of said lead finger and withdrawn from at least one side of perimeter of said surface of said lead finger, such that lead frame material is provided on at least one side of said first surface of said bonding pad as an attachment surface for molding.

* * * * *